(12) United States Patent
Clampitt et al.

(10) Patent No.: US 12,010,847 B2
(45) Date of Patent: Jun. 11, 2024

(54) FOUNDATIONAL SUPPORTS WITHIN INTEGRATED ASSEMBLIES

(71) Applicant: Micron Technology, Inc., Boise, ID (US)

(72) Inventors: Darwin A. Clampitt, Wilder, ID (US);
Matthew J. King, Boise, ID (US);
John D. Hopkins, Meridian, ID (US);
M. Jared Barclay, Middleton, ID (US)

(73) Assignee: Micron Technology, Inc., Boise, ID (US)

( * ) Notice: Subject to any disclaimer, the term of this patent is extended or adjusted under 35 U.S.C. 154(b) by 211 days.

(21) Appl. No.: 17/691,993

(22) Filed: Mar. 10, 2022

(65) Prior Publication Data
US 2022/0199644 A1 Jun. 23, 2022

Related U.S. Application Data

(63) Continuation of application No. 16/739,332, filed on Jan. 10, 2020, now Pat. No. 11,302,710.

(51) Int. Cl.
| | | |
|---|---|---|
| H10B 43/27 | (2023.01) | |
| H01L 23/48 | (2006.01) | |
| H01L 23/528 | (2006.01) | |
| H10B 41/10 | (2023.01) | |
| H10B 41/27 | (2023.01) | |
| H10B 41/40 | (2023.01) | |
| H10B 43/10 | (2023.01) | |
| H10B 43/40 | (2023.01) | |

(52) U.S. Cl.
CPC ........... *H10B 43/27* (2023.02); *H01L 23/481* (2013.01); *H01L 23/528* (2013.01); *H10B 41/10* (2023.02); *H10B 41/27* (2023.02); *H10B 41/40* (2023.02); *H10B 43/10* (2023.02); *H10B 43/40* (2023.02)

(58) Field of Classification Search
CPC ........ H10B 43/27; H10B 41/40; H10B 43/40; H01L 23/528
See application file for complete search history.

(56) References Cited

U.S. PATENT DOCUMENTS

| | | | |
|---|---|---|---|
| 10,614,862 B2 | 4/2020 | Russo | |
| 10,847,539 B2 | 11/2020 | Wei et al. | |
| 2015/0380418 A1 | 12/2015 | Zhang et al. | |
| 2016/0133638 A1 | 5/2016 | Simsek-Ege et al. | |
| 2017/0358594 A1* | 12/2017 | Lu | H10B 41/27 |

(Continued)

FOREIGN PATENT DOCUMENTS

| | | |
|---|---|---|
| CN | 109346478 | 2/2019 |
| CN | 110010616 | 7/2019 |

(Continued)

*Primary Examiner* — Jay C Chang
*Assistant Examiner* — Mikka Liu
(74) *Attorney, Agent, or Firm* — Wells St. John P.S.

(57) ABSTRACT

Some embodiments include an integrated assembly having a base (e.g., a monocrystalline silicon wafer), and having memory cells over the base and along channel-material-pillars. A conductive structure is between the memory cells and the base. The channel-material-pillars are coupled with the conductive structure. A foundational structure extends into the base and projects upwardly to a level above the conductive structure. The foundational structure locks the conductive structure to the base to provide foundational support to the conductive structure.

17 Claims, 11 Drawing Sheets

(56) References Cited

U.S. PATENT DOCUMENTS

2017/0373087 A1* 12/2017 Ito .......................... H10B 43/50
2019/0189629 A1 6/2019 Parekh et al.
2021/0126008 A1 4/2021 Tanabe et al.

FOREIGN PATENT DOCUMENTS

| CN | 110034120 | 7/2019 |
| CN | 202110003214.4 | 12/2023 |

\* cited by examiner

FOUNDATIONAL SUPPORTS WITHIN INTEGRATED ASSEMBLIES

RELATED PATENT DATA

This patent resulted from a continuation of U.S. patent application Ser. No. 16/739,332 filed Jan. 10, 2020 which is hereby incorporated by reference herein.

TECHNICAL FIELD

Integrated assemblies. Foundational supports within integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Figure 1:
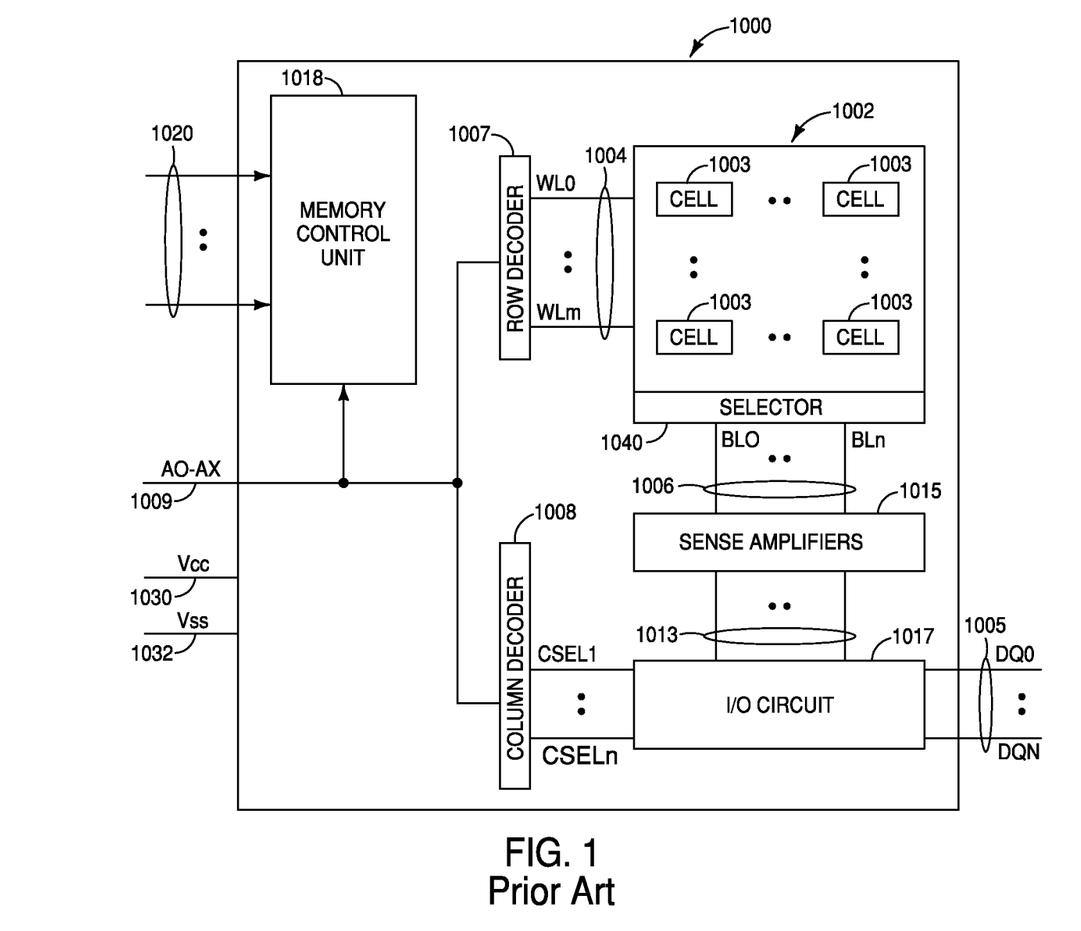
FIG. 1 shows a block diagram of a prior art memory device having a memory array with memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

Figure 2:
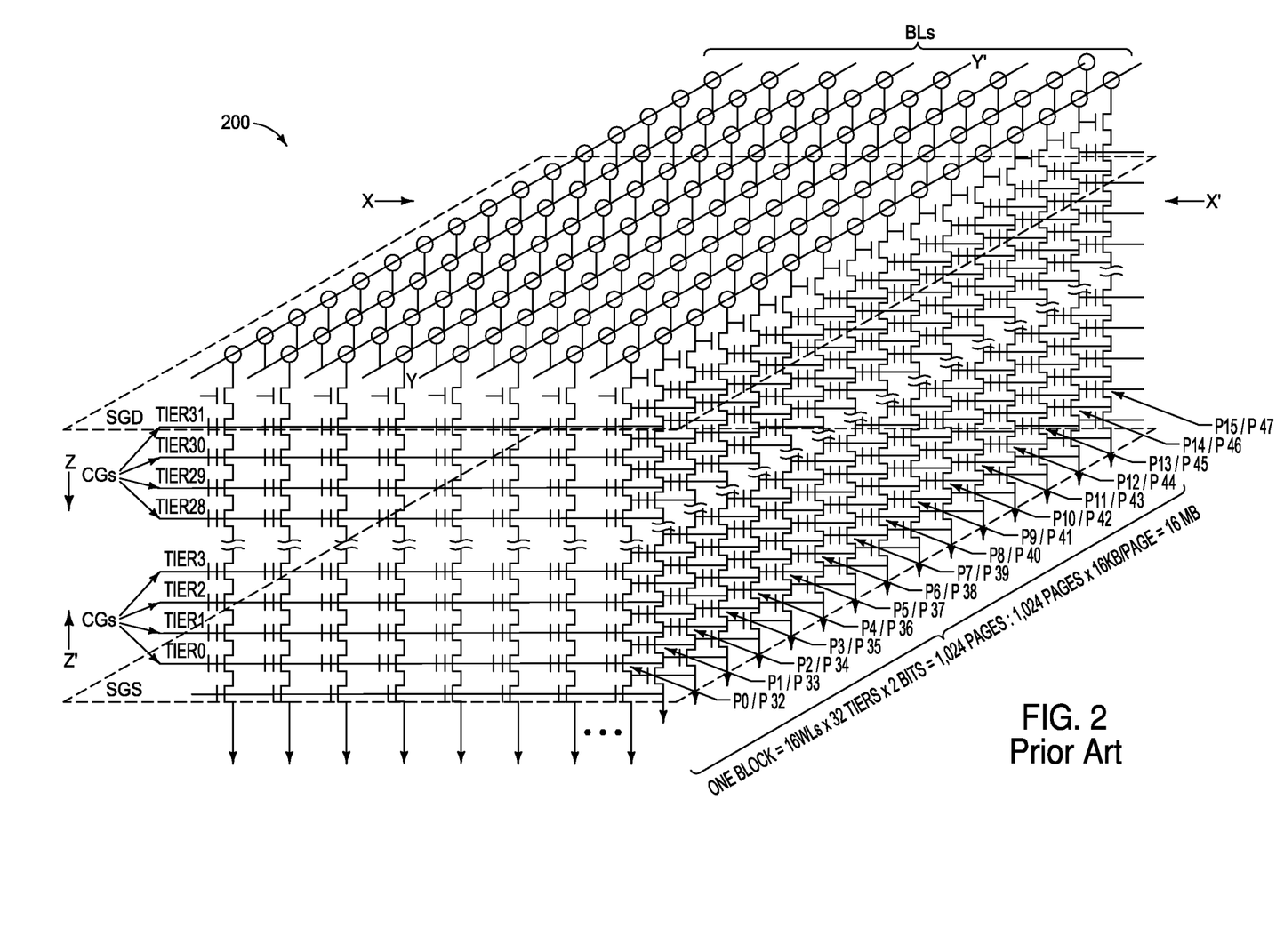
FIG. 2 shows a schematic diagram of the prior art memory device of FIG. 1 in the form of a 3D NAND memory device.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

Figure 3:
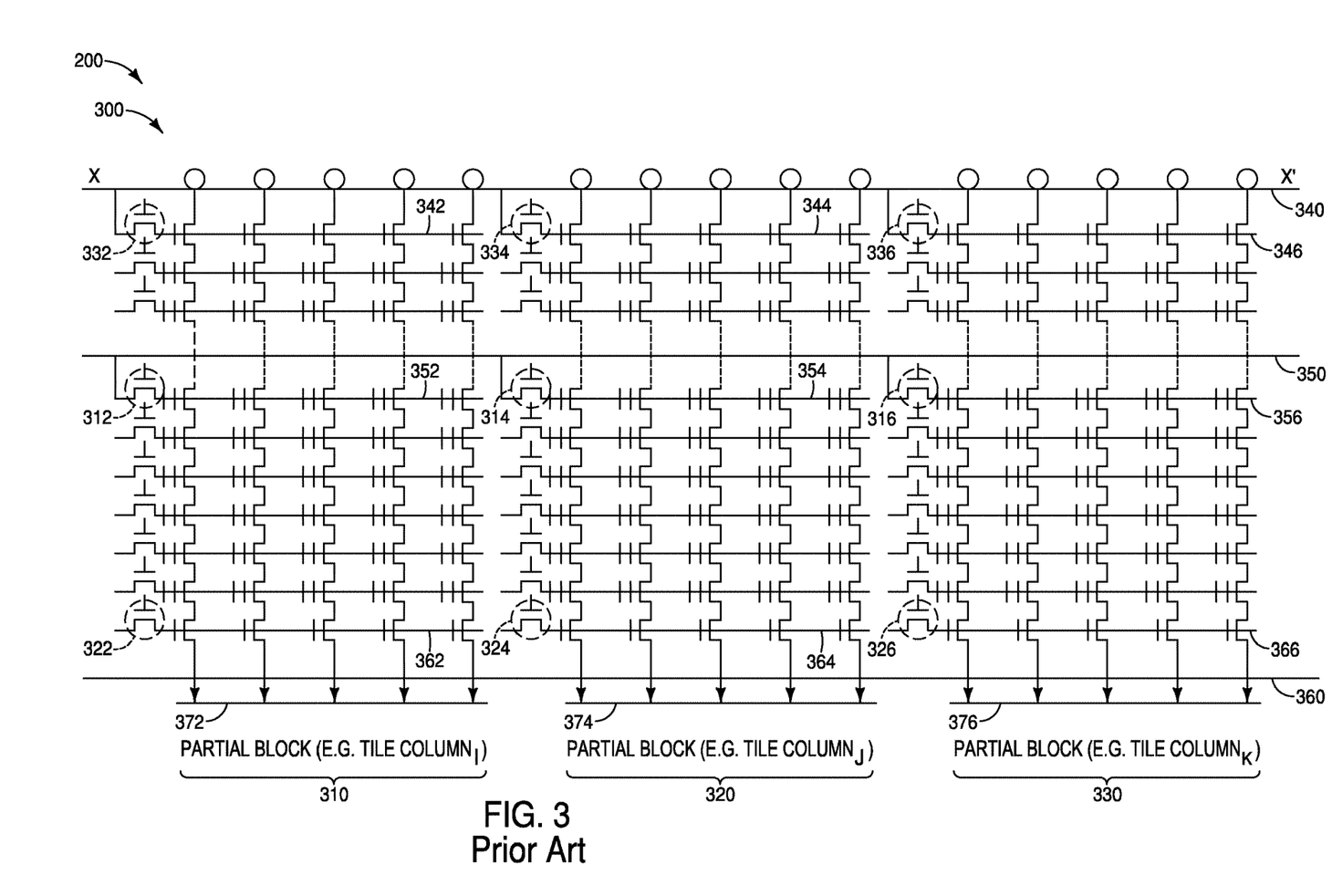
FIG. 3 shows a cross-sectional view of the prior art 3D NAND memory device of FIG. 2 in an X-X' direction.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_i$, tile column$_j$ and tile column$_K$, with each subset (e.g., tile column) comprising a "partial block" (sub-block) of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

Figure 4:
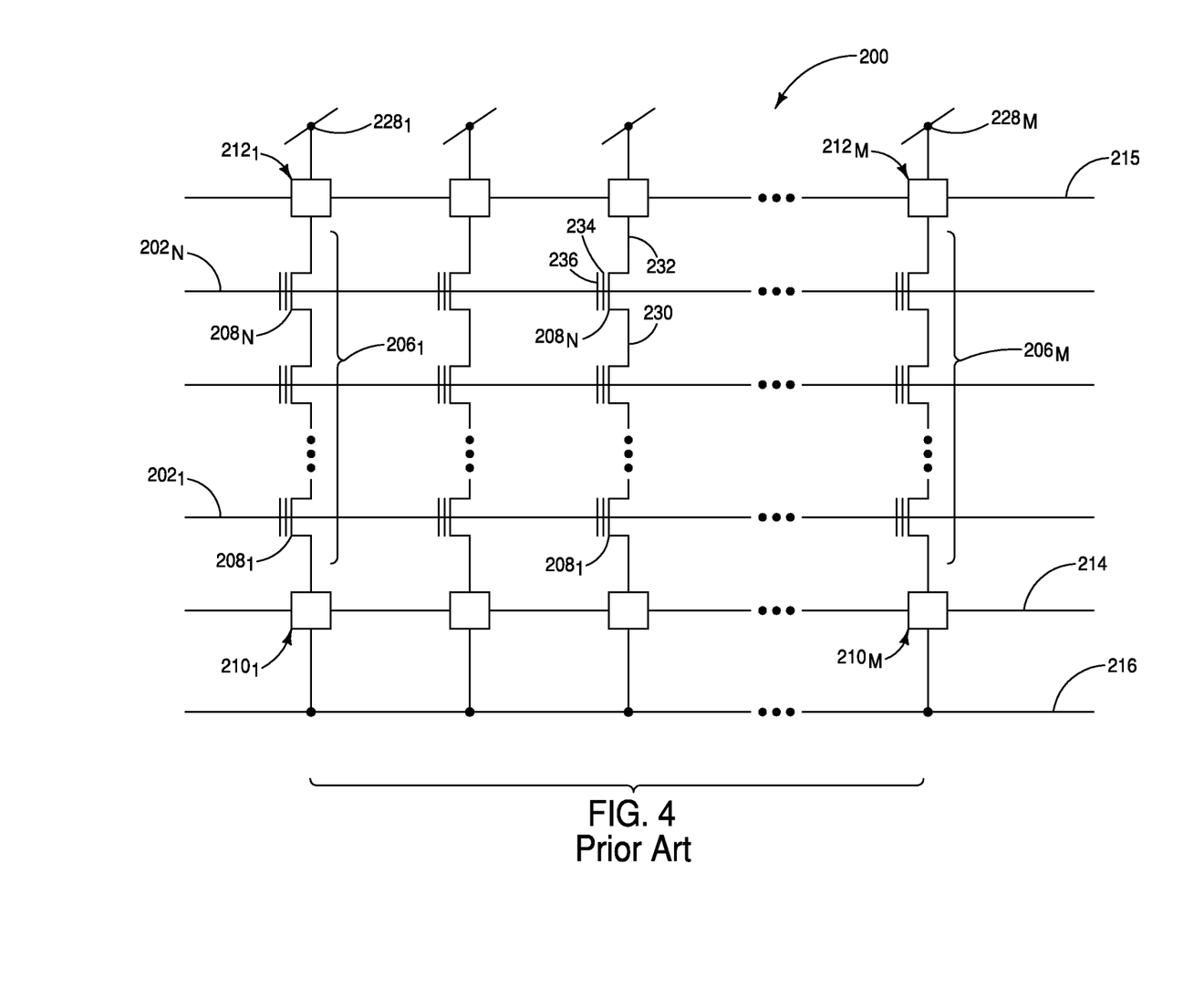
FIG. 4 is a schematic diagram of a prior art NAND memory array.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

The vertically-stacked memory cells of three-dimensional NAND architecture may be block-erased by generating hole carriers beneath them, and then utilizing an electric field to sweep the hole carriers upwardly along the memory cells.

Modern NAND architecture may comprise multiple levels stacked one atop another. A problem that may be encountered is that the levels may delaminate or otherwise structurally shift relative to one another. It would be desirable to develop architectures which address such problem.

BRIEF DESCRIPTION OF THE DRAWINGS

FIGS. 5 and 5A are diagrammatic views of a region of an example integrated assembly.

DETAILED DESCRIPTION OF THE ILLUSTRATED EMBODIMENTS

Some embodiments include configurations having foundational structures (e.g., foundational-support-pins, foundational-support-walls, etc.) which penetrate into a base (e.g., which penetrate into monocrystalline silicon of a wafer). The foundational structures may extend to levels over the base and may lock the levels to the base to provide foundational support for the levels. In some example arrangements the foundational structures may extend to conductive-source-structures associated with a memory array and may provide foundational support for the conductive-source-structures. Example embodiments are described with reference to FIGS. 5-12.

Figure 5:
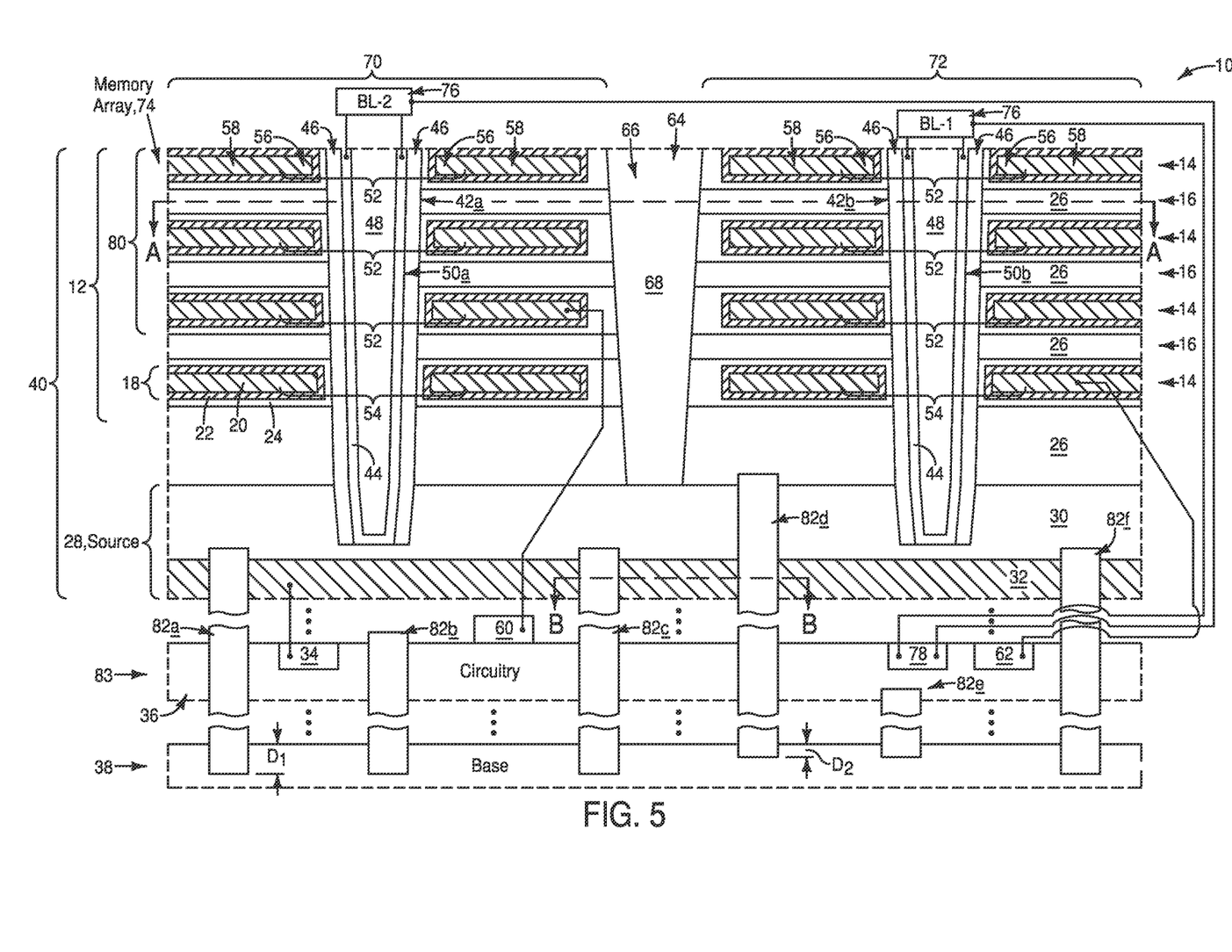
FIG. 5 is a diagrammatic cross-sectional side view.
Figure 5A:
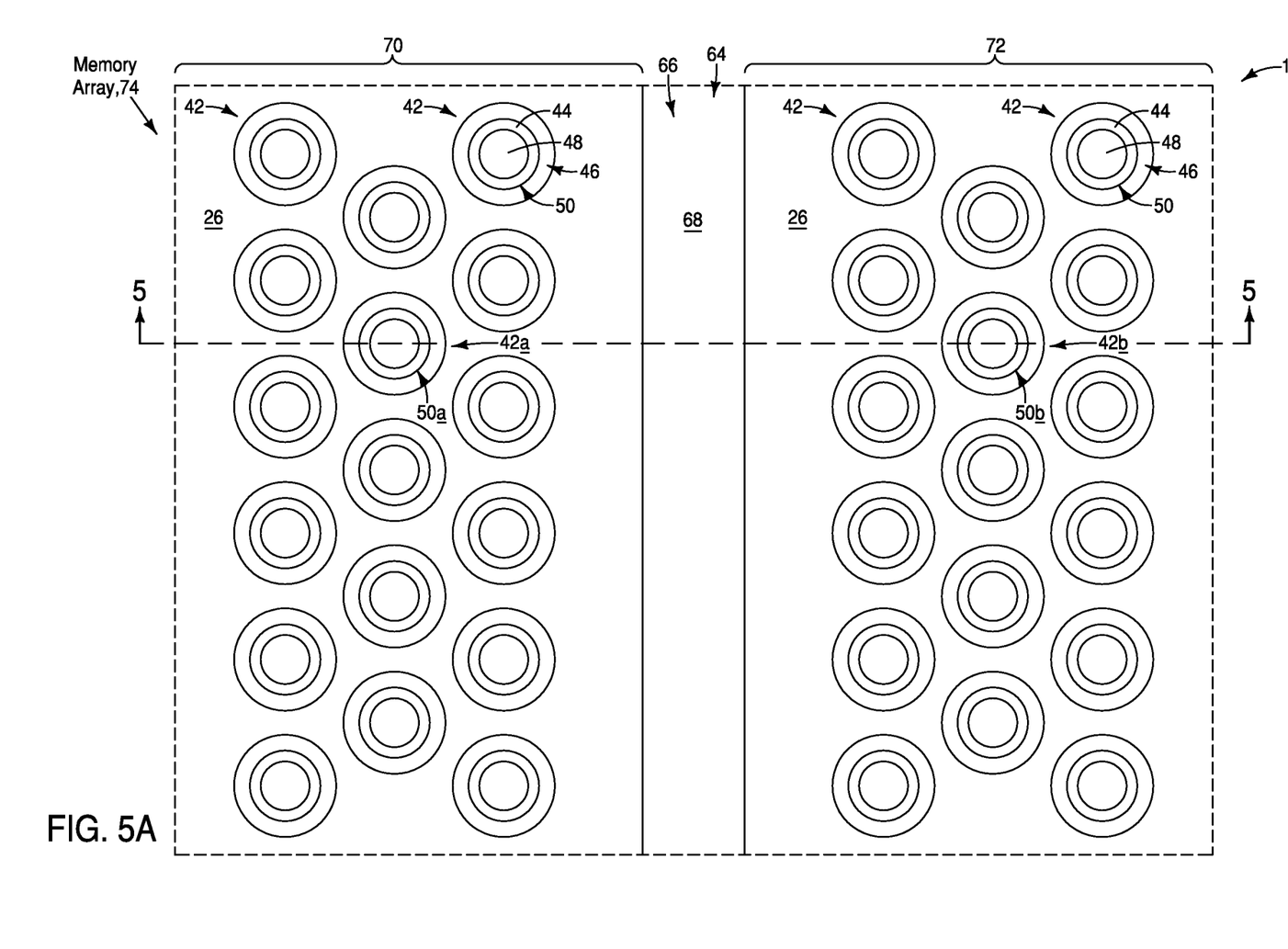
FIG. 5A is a diagrammatic top-down view along the line A-A of FIG. 5. The cross-sectional side view of FIG. 5 is along the line 5-5 of FIG. 5A.

Referring to FIGS. 5 and 5A, an integrated assembly 10 includes a stack 12 of alternating conductive levels 14 and insulative levels 16.

The conductive levels 14 include conductive regions 18. The conductive regions 18 may comprise any suitable composition(s). In the shown embodiment, the conductive regions include a conductive core material 20 (e.g., tungsten), and a conductive liner material 22 (e.g., titanium nitride) which at least partially surrounds the core material.

Dielectric-barrier material 24 extends at least partially around the conductive regions 18. The dielectric-barrier material 24 may comprise any suitable composition(s); and in some embodiments comprises high-k material (e.g., AlO, where the chemical formula indicates primary constituents rather than a specific stoichiometry). The term high-k means a dielectric constant greater than that of silicon dioxide.

The insulative levels 16 comprise insulative material 26. The insulative material 26 may comprise any suitable composition(s); and in some embodiments may comprise, consist essentially of, or consist of silicon dioxide. In some embodiments, the levels 16 may be referred to as intervening levels provided between the conductive levels 14.

A conductive structure (source structure, conductive-source-structure) 28 is under the stack 12, and in the shown embodiment is spaced from the stack 12 by additional insulative material 26. The source structure 28 comprises materials 30 and 32. The material 30 may comprise conductively-doped semiconductor material (e.g., conductively-doped silicon), and the material 32 may be a metal-containing material (e.g., WSi, where the chemical formula indicates primary constituents rather than a specific stoichiometry).

The source structure 28 may be analogous to the source structures 216 described in the "Background" section. The source structure is coupled with control circuitry (e.g., CMOS) 34 which is part of the circuitry 36 within a circuitry level 83. The control circuitry 34 may be directly under the source structure 32 (as shown) or may be in any other suitable location.

The source structure 28 and circuitry level 83 are shown to be supported by a base 38. The base 38 may comprise semiconductor material; and may, for example, comprise, consist essentially of, or consist of monocrystalline silicon. The base 38 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The base 38 is shown to be spaced from the circuitry level 83 by a gap. Such gap is utilized to indicate that there may be additional levels, compositions, devices, etc., between the base 38 and the circuitry level 83.

The circuitry level 83 is shown to be spaced from the source structure 28 by a gap. Such gap is utilized to indicate that there may be additional levels, compositions, devices, etc., between the circuitry level 83 and the source structure 28.

The stack 12 and source 28 are shown be comprised by an upper level 40. The levels 40 and 83 may be considered to be supported by the base 38.

Pillars 42 extend through the stack 12, through the material 30 of the source structure 28, and to an upper surface of the metal-containing material 32 within the source structure 28. The pillars 42 along the cross-section of FIG. 5 are labeled as 42a and 42b so that they may be distinguished relative to one another. The pillars 42a and 42b may be referred to as first and second pillars, respectively.

The pillars 42 include channel-material 44, cell materials within a region 46 adjacent the channel material, and dielectric material 48. In some embodiments, the channel material 44 may be considered to be configured as channel-material-pillars (or channel-material-cylinders) 50 which are comprised by the pillars 42. The channel-material-pillars 50 along the cross-section of FIG. 5 are labeled as 50a and 50b so that they may be distinguished relative to one another.

The channel-material-pillars 50a and 50b may be referred to as first and second channel-material-pillars, respectively.

The memory cell materials within the regions 46 may comprise tunneling material, charge-trapping material and charge-blocking material.

Memory cells 52 and select devices (SGS devices) 54 are along the conductive levels 14. Although only one of the conductive levels 14 is shown to be incorporated into the source-select devices 54, in other embodiments multiple conductive levels may be incorporated into the source-select devices. The conductive levels may be electrically coupled with one another (ganged) to be together incorporated into long-channel source-select devices.

The memory cells 52 (e.g., NAND memory cells) are vertically stacked one atop another. Each of the memory cells 52 comprises a region of the semiconductor material (channel material) 44, and comprises regions (control gate regions) 56 of the conductive levels 14. The regions of the conductive levels which are not comprised by the memory cells 52 may be considered to be wordline regions (or routing regions) 58 which couple the control gate regions 56 and or SGS devices 54 with driver circuitry 60 and/or other suitable circuitry 62.

The memory cells 52 comprise segments of the cell materials (e.g., the tunneling material, charge-storage material, dielectric-barrier material and charge-blocking material) within the regions 46.

In some embodiments, the conductive levels 14 associated with the memory cells 52 may be referred to as wordline/control gate levels (or memory cell levels), in that they include wordlines and control gates associated with vertically-stacked memory cells of NAND strings. The NAND strings may comprise any suitable number of memory cell levels. For instance, the NAND strings may have 8 memory cell levels, 16 memory cell levels, 32 memory cell levels, 64 memory cell levels, 512 memory cell levels, 1024 memory cell levels, etc.

An opening (slit, trench) 64 extends through the conductive levels 14, and an insulative material 68 is provided within such opening. The insulative material 68 is configured as a panel 66. The panel 66 may extend in and out of the page relative to the cross-sectional view of FIG. 5, as indicated in the top-down view of FIG. 5A.

In some embodiments, the pillars 42 may be considered to be representative of a large number of substantially identical channel material pillars extending across the memory assembly 10; with the term "substantially identical" meaning identical to within reasonable tolerances of fabrication and measurement. FIG. 5A shows the pillars 42 arranged within a matrix (with the pillars 42 being hexagonally-packed in the illustrated embodiment), and shows the slit 64 (and the panel 66 therein) extending through the matrix of the channel material pillars. In some embodiments, the slit 64 (and the panel 66 therein) may divide the pillars between a first block region 70 and a second block region 72. Accordingly, the memory cells 52 on one side of the slit 64 may be considered to be within the first block region 70, and the memory cells 52 on the other side of the slit 64 may be considered to be within the second block region 72. The block regions 70 and 72 may be analogous to the blocks (or sub-blocks) described above in the "Background" section of this disclosure.

The channel-material-pillars 50 are electrically coupled with bitlines 76 (identified as BL-1 and BL-2 in FIG. 5). Such bitlines may be electrically coupled with logic circuitry (e.g., CMOS) 78 associated with the circuitry level 83. In some embodiments, the logic circuitry 78 may correspond to sensing circuitry (e.g., sense-amplifier-circuitry).

The integrated assembly 10 of FIGS. 5 and 5A may be considered to comprise a memory array region 74 comprising the memory cells 52. Each of the memory cells 52 may be uniquely addressed with one of the bitlines 76, and one of the routing features (wordlines) 58. In some embodiments, the memory array region 74 may be considered to be within a memory level 80, and such memory level may be considered to be over the conductive-source-structure 28, which is over the circuitry level 83, which in turn is over the base 38.

Foundational structures (support structures, foundational-support-structures) 82 extend into the base 38. The foundational structures 82 are labeled as 82a-f so that they may be distinguished relative to one another.

The foundational structures 82 may extend into the base 38 to any suitable depth; and may all extend to the same depth within the base 38, or may extend to different depths relative to one another. In the illustrated embodiment, some of the foundational structures (e.g., the foundational structure 82a) extend to a first depth $D_1$ and others (e.g., the foundational structure 82d) extend to a second depth $D_2$. The base 38 may comprise monocrystalline silicon (e.g., bulk monocrystalline silicon of a semiconductor wafer), and the foundational structures may extend into such monocrystalline silicon to a suitable depth to provide structural support for locking materials and structures from one or more of the levels above the base 38 to the base 38. Accordingly, the foundational structures 82 may alleviate or prevent problematic shifting of materials and structures associated with levels above the base. In some embodiments, the foundational structures 82 may extend into the monocrystalline of the base 38 to a depth of at least about 50 nanometers (nm), at least about 100 nm, at least about 500 nm, or within a range of from about 50 nm to about 1 micrometer (μm, micron).

The foundational structures 82 project upwardly from the base through various materials above the base. In the illustrated embodiment, the example foundational structures 82a, 82c, 82d and 82f extend upwardly through the metal-containing material 32 of the conductive-source-structure 28, with the foundational structure 82d also extending through the semiconductor material 30 of the conductive-source-structure 28. The example foundational structure 82b extends upwardly through the circuitry 36, but does not penetrate into the conductive-source-structure 28. The example foundational structure 82e extends partially into the circuitry 36, but does not extend entirely through the circuitry level 83. The illustrated foundational structures 82a-f may be considered to be representative of foundational structures which may be utilized for supporting materials and structures within the levels 40 and 83 of the assembly 10. In other embodiments the foundational structures may project to other heights than those specifically illustrated in FIG. 5. Regardless, the foundational structures lock materials and structures within the levels 40 and 83 to the base 38. For instance, the structures 82a, 82c, 82d and 82f may be considered to lock the conductive-source-structure 28 to the base 38 to provide foundational support to the conductive-source-structure (e.g., to prevent shifting of the conductive-source-structure relative to the base 38).

Figure 6:
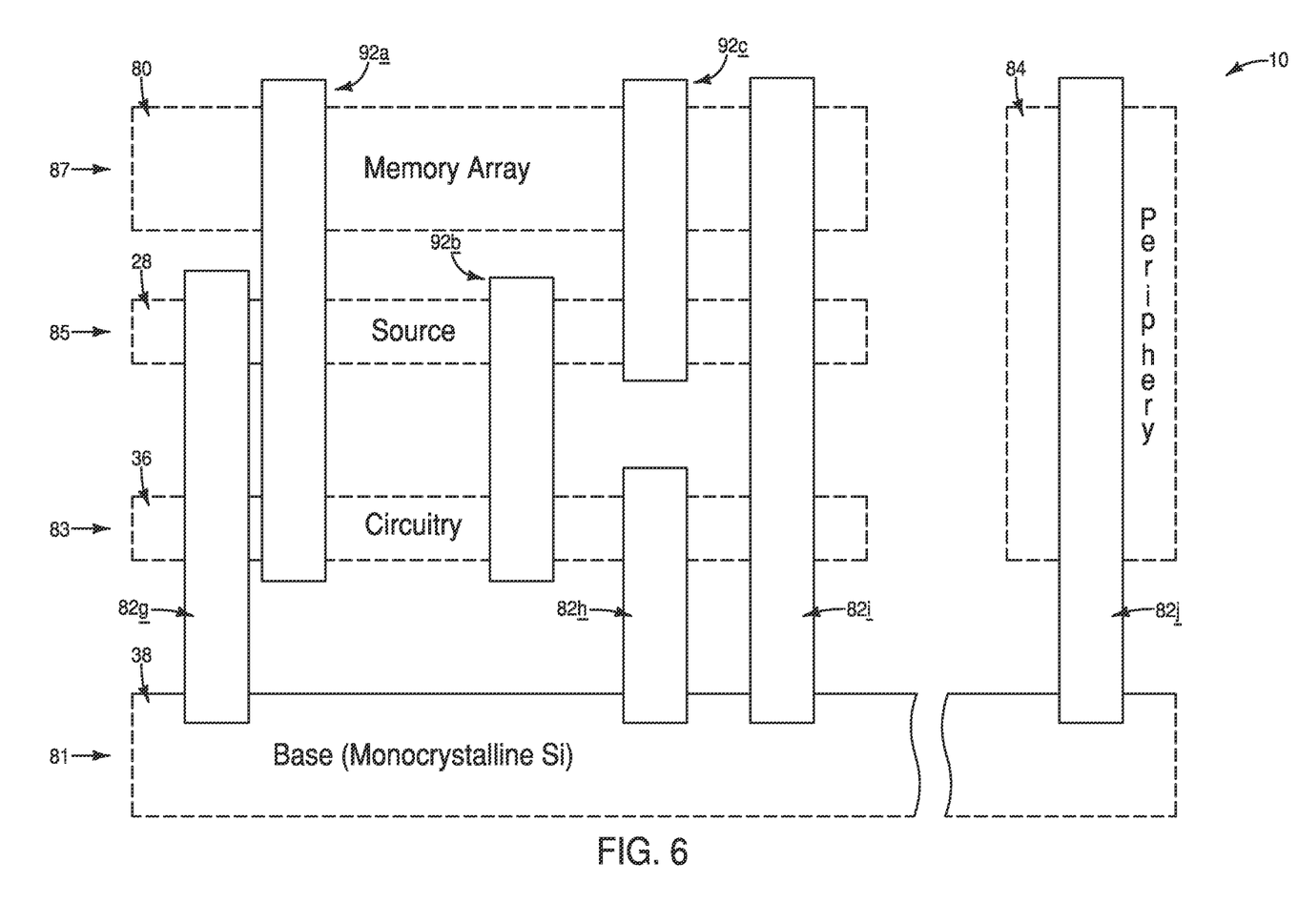
FIG. 6 is a diagrammatic cross-sectional side view of a region of another example integrated assembly.

FIG. 6 shows a more generalized view of an assembly 10 comprising example foundational structures 82, with such structures being labeled as 82g-i in FIG. 6 so that they may be distinguished relative to one another. The assembly 10 of FIG. 6 includes the base 38 at a first level 81, the circuitry 36 at a second level 83, the source structure 28 at a third level 85, and the memory array region 80 at a fourth level 87. The levels 81, 83, 85 and 87 may correspond to different tiers within a same semiconductor die (wafer) as one another, or may correspond to tiers arranged within two or more vertically-stacked semiconductor dies. A region 84 is shown to be peripheral to the memory array region 80. The region 84 may be referred to as a periphery or as a peripheral region.

The example foundational structures 82g-j extend to suitable depths within the monocrystalline silicon of the base 38 (e.g., to depths within a range of from about 50 nm to about 1 μm), and then project to heights which stabilize materials within one or more of the levels 83, 85 and 87 (the projections 82g-i), and which stabilize materials within the peripheral region 84 (the projection 82j).

FIG. 6 also shows additional example foundational structures 92a-c which extend through two or more of the levels 83, 85 and 87, but which do not extend into the base 81. In some embodiments, the foundational structures 92a and 92b may be representative of foundational structures utilized to anchor one or both of the levels 85 and 87 to the circuitry level 83, and the foundational structure 92c may be representative of foundational structures utilized to anchor one or more of the tiers of the memory array level 87 with the source level 85. The foundational structures 92a-c may extend entirely through one or more of various levels (as shown), and/or may penetrate into one or more of the levels without penetrating through said one or more of the levels. In some embodiments, the foundational structures 82g-j may be configured as pins, and may be referred to as first foundational-support-pins; and the foundational structures 92a-c may be configured as pins, and may be referred to as second foundational-support-pins.

The foundational structures 82 and 92 of FIGS. 5 and 6 may comprise any suitable composition(s). In some embodiments, one or more of the foundational structures may comprise insulative material, such as, for example, one or more of silicon nitride, silicon dioxide, aluminum oxide, etc. In some embodiments, one or more of the foundational structures may comprise conductive material; such as, for example, one or more of tungsten, titanium, tungsten nitride, tungsten silicide, titanium nitride, titanium silicide, etc. In some embodiments, one or more of the foundational structures may comprise semiconductor material; such as, for example, one or both of silicon and germanium.

The foundational structures 82 and 92 may be homogeneous, or may comprise laminates of two or more discrete compositions. For instance, FIG. 7-9 show cross-sectional top-down views along the line B-B of FIG. 5, and show example foundational structures 82c and 82d comprising different configurations.

Figure 7:
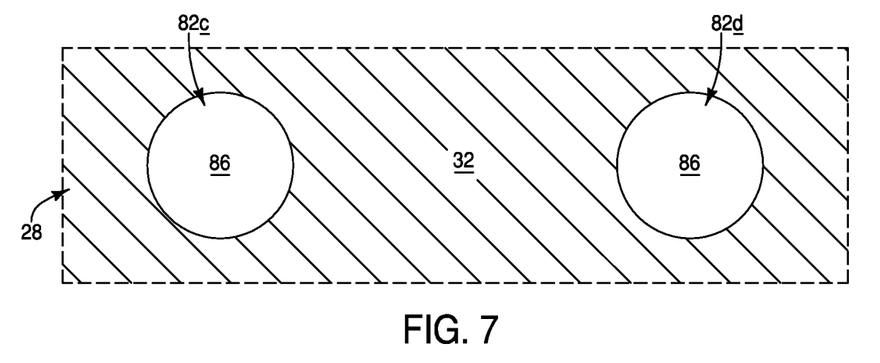
FIGS. 7-9 are diagrammatic cross-sectional top-down views along the line B-B of FIG. 5 illustrating example configurations of example foundational structures.

FIG. 7 shows the foundational structures 82c and 82d comprising a homogeneous composition 86. Such homogeneous composition may be electrically insulative in some embodiments; and may, for example, comprise, consist essentially of, or consist of one or more of silicon dioxide, silicon nitride, aluminum oxide, hafnium oxide, zirconium oxide, etc.

Figure 8:
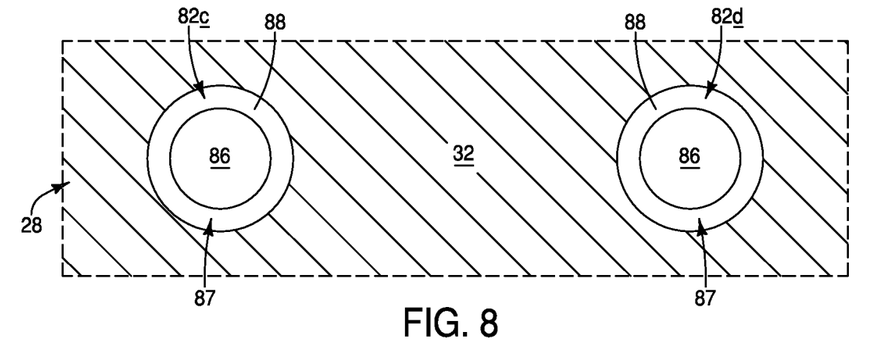

FIG. 8 shows the foundational structures 82c and 82d comprising an inner core composition 86, and an outer liner composition 88 laterally surrounding the core composition. The material 88 may be considered to be configured as an insulative liner (or sheath) 87. In some embodiments, the core composition 86 may comprise insulative material (e.g., silicon dioxide, silicon nitride, etc.) and/or semiconductor material (e.g., germanium, silicon, etc.); and the liner composition 88 may comprise insulative material (e.g., silicon dioxide, silicon nitride, etc.).

Figure 9:
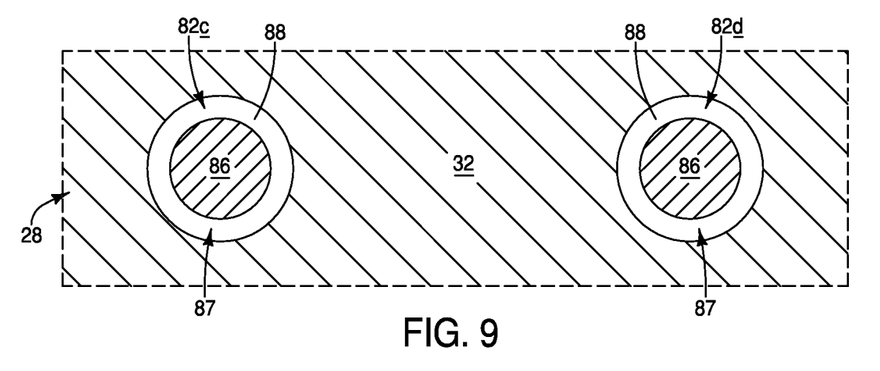

FIG. 9 shows another embodiment in which the foundational structures 82c and 82d comprise the inner core composition 86 and the outer liner composition 88. In the embodiment of FIG. 9 the inner core composition 86 is a metal-containing composition; and may, for example, comprise one or more metals (e.g., tungsten, titanium, etc.) and/or metal-containing compositions (e.g., metal silicide, metal nitride, metal carbide, etc.).

The illustrated foundational structures 82c and 82d are configured as pins (posts, nails, etc.) which penetrate through the conductive material 32 of the source structure 28. Such pins have circular-shaped lateral peripheries along the top-down cross-sections of FIGS. 7-9. In other embodiments the pins may have other shapes; and may, for example, have elliptical, rectangular, square, etc., lateral peripheries along the top-down views of FIGS. 7-9. Also, it is to be understood that even though the foundational structures 82c and 82d have the same shapes and compositions relative to one another in the embodiments of FIGS. 7-9, in other embodiments the foundational structures 82c and 82d may have different shapes and/or compositions relative to one another.

Figure 10:
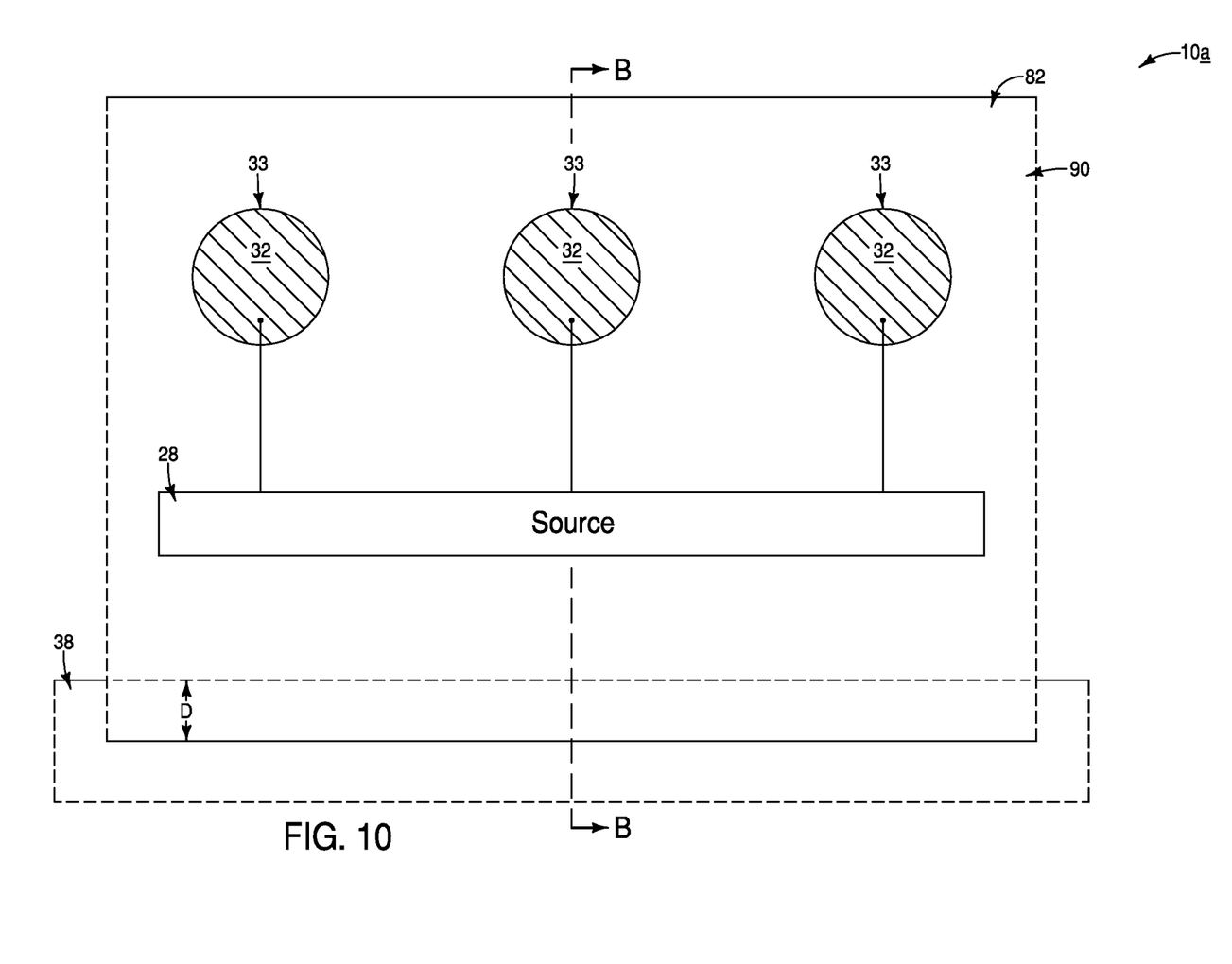
FIGS. 10 and 11 are diagrammatic cross-sectional side views a region of an example integrated assembly. The view of FIG. 10 is along the line A-A of FIG. 11, and the view of FIG. 11 is along the line B-B of FIG. 10.
Figure 11:
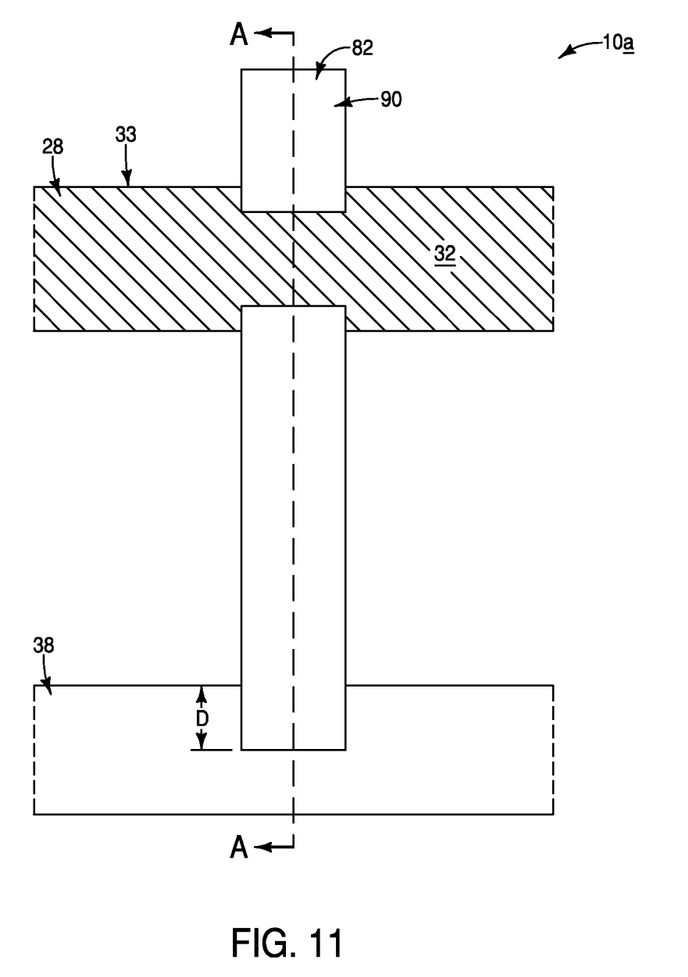

The foundational structures 82 and 92 may have other configurations besides the pin (post, nail) configuration of FIG. 7-9. For instance, in some embodiments at least some of the foundational structures 82 and 92 may be configured as walls (panels). FIGS. 10 and 11 show a region of an example integrated assembly 10a having a foundational structure 82 configured as a wall 90; with the cross-section of FIG. 10 being along the line A-A of FIG. 11, and with FIG. 11 being along the line B-B of FIG. 10.

The wall extends into the base 38 to a depth D. Such depth may be any suitable depth, and in some embodiments may be within a range of from about 50 nm to about 1 µm.

The wall 90 extends to a height which is above an upper surface 33 of the metal-containing material 32 of the source structure 28.

In the illustrated embodiment, the metal-containing material 32 of the source structure penetrates through (passes through) the wall 90.

Figure 12:
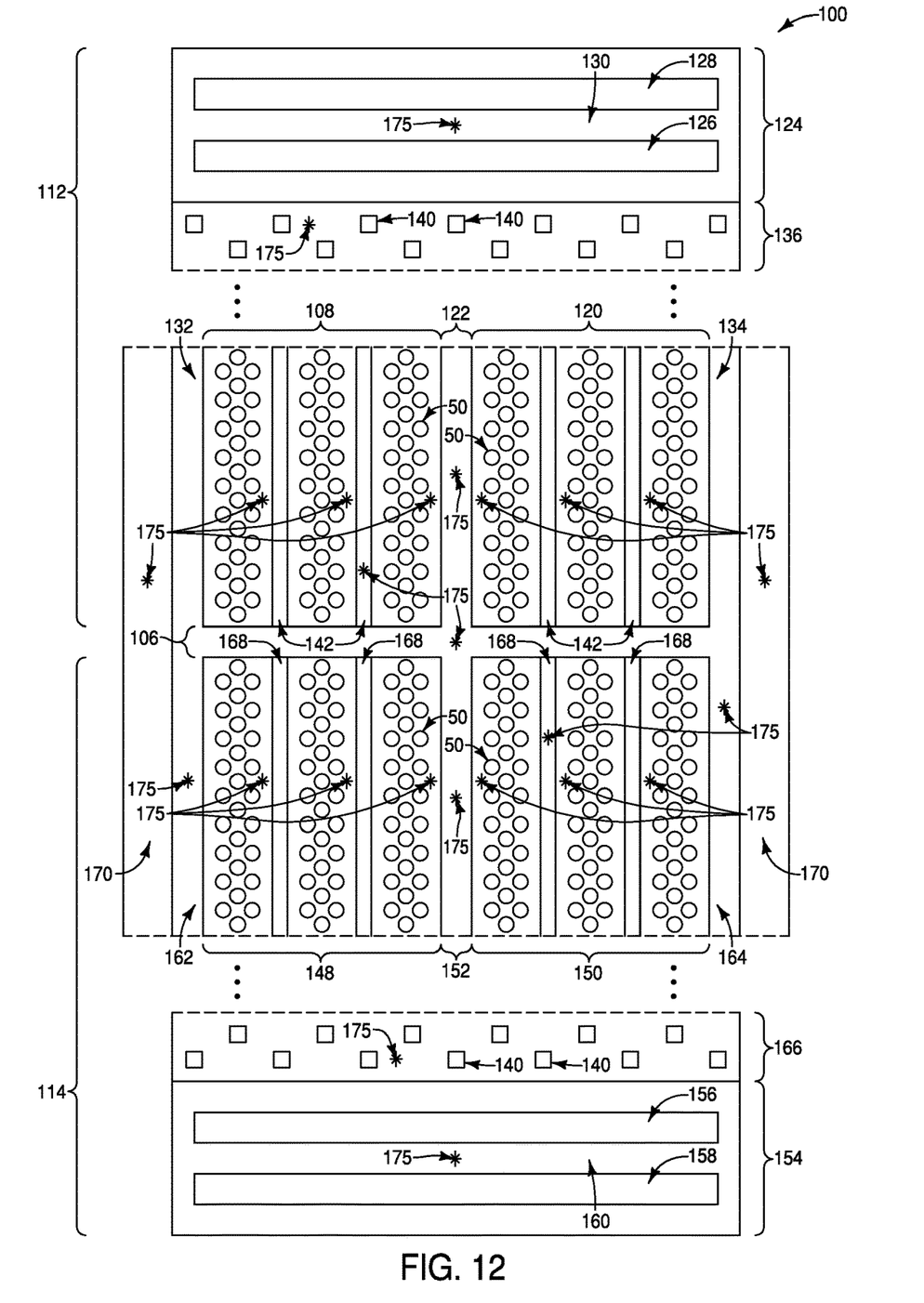
FIG. 12 is a diagrammatic top-down view of a region of another example integrated assembly.

FIG. 12 is a top-down view of a region of a conventional die configuration 100 comprising conventional memory devices, and is provided to assist the reader in understanding possible locations for placement of foundational structures relative to the die configuration. The die configuration 100 includes a pair of memory device tiles (or tile regions) 112 and 114, with the tiles being spaced from one another by an inter-tile region 106.

The tile 112 comprises a first memory device sub-block (or block region) 108, and a second memory device sub-block (or block region) 120; with the sub-blocks 108 and 120 being spaced from one another by an intervening inter-block region 122.

The tile 112 also includes an interconnect region (e.g., staircase region) 124 for establishing connections to individual conductive levels of a wordline stack. The illustrated interconnect region 124 includes a pair of spaced-apart trenches 126 and 128 for establishing connections to different sets of the conductive levels, and includes a region 130 between the spaced-apart trenches.

Additionally, the tile 112 includes memory array regions 132 and 134 within the sub-blocks 108 and 120, respectively; and includes an intervening region 136 between the interconnect region 124 and the memory array regions 132 and 134. Channel material pillars 50 are within the memory array regions 132 and 134, and pass through a stack of conductive levels (14, shown in FIG. 5). Support structures 140 are within the intervening region 136, and also pass through the stack of conductive levels.

A gap is provided between the intervening region 136 and the memory array regions 132 and 134 to indicate that there may be a distance between the memory array regions and the intervening region 136, and also to indicate that there may be additional components between the memory array region and the intervening region 136.

Routing regions 142 extend through the memory array regions 132 and 134. The routing regions may provide access for bitlines and/or other components.

The tile 114 comprises features analogous to those described above with reference to the tile 112. Specifically, the tile 114 comprises a first memory device sub-block (or block region) 148, and a second memory device sub-block (or block region) 150; with the sub-blocks 148 and 150 being spaced from one another by an intervening inter-block region 152. The tile 114 includes an interconnect region (e.g., staircase region) 154 having a pair of spaced-apart trenches 156 and 158, and includes a region 160 between the spaced-apart trenches. The tile 114 also includes memory array regions 162 and 164 within the sub-blocks 148 and 150, respectively; and includes an intervening region 166 between an interconnect region 154 and the memory array regions 162 and 164. The channel material pillars 50 are within the memory array regions 162 and 164, and the support structures 140 are within the intervening region 166. Routing regions 168 extend through the memory array regions 162 and 164, with such routing regions being analogous to the routing regions 142 discussed above.

A sidewall periphery (sidewall-peripheral-region) 170 is along sides of the tiles 112 and 114. The sidewall-peripheral-region 170 is not shown along the intervening regions 136 and 166, or along the interconnect regions 124 and 154, but in some applications may extend along one or more of such regions.

The foundational supports 82 and 92 described herein may be provided in any suitable locations relative to the die configuration 100 of FIG. 12; with example locations being indicated with the symbol *, and the label 175. For instance, the foundational supports may be provided to extend through source structures 28 (described above in, for example, FIGS. 5 and 6) associated with one or more of the memory array regions 132, 134, 162 and 164, as indicated. Additionally, or alternatively, the foundational supports may be provided in regions peripheral to the memory array regions 132, 134, 162 and 164; with example peripheral regions being within the illustrated regions 124, 136, 154, 166, 170, etc. Additionally, or alternatively, the foundational supports may be provided within one or more of the routing regions 142 and 168.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a base, and having memory cells over the base and along channel-material-pillars. A conductive structure is between the memory cells and the base. The channel-material-pillars are coupled with the conductive structure. A foundational structure extends into the base and projects upwardly to a level above the conductive structure. The foundational structure locks the conductive structure to the base to provide foundational support to the conductive structure.

Some embodiments include an integrated assembly comprising a base and a conductive-source-structure over the base. A memory level is over the conductive-source-structure and comprises memory cells along channel-material-pillars. The channel-material-pillars are coupled with the conductive-source-structure. Foundational-support-pins extend into the base and project upwardly through the conductive-source-structure. The foundational-support-pins lock the conductive-source-structure to the base to provide foundational support to the conductive-source-structure.

Some embodiments include an integrated assembly comprising a base and a first-circuitry-level over the base. The first-circuitry-level comprises logic circuitry. A second-circuitry-level is over the first-circuitry-level and comprises a conductive-source-structure. A memory level is over the second-circuitry-level and comprises memory cells along channel-material-pillars. The channel-material-pillars are coupled with the conductive-source-structure. The memory cells are along conductive levels which include gate structures and routing structures. The routing structures are coupled with circuitry within the first-circuitry-level. The channel-material-pillars are coupled with bitlines. The bitlines are coupled with circuitry within the first-circuitry-level. A foundational structure extends into the base and projects upwardly to a level above the conductive-source-structure. The foundational structure locks the conductive-source-structure to the base to provide foundational support to the conductive-source-structure.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
a base;
memory cells over the base and along channel-material-pillars;
a conductive structure between the memory cells and the base, the conductive structure extending under each of the memory cells with the channel-material-pillars being coupled with the conductive structure; and
a foundational structure comprising an insulative material extending into the base and projecting upwardly to a level above the conductive structure, an upper surface of the foundational structure being elevationally lower than all the memory cells.

2. The integrated assembly of claim 1 wherein the foundational structure penetrates entirely through the conductive structure.

3. The integrated assembly of claim 2 wherein the foundational structure is configured as a post.

4. The integrated assembly of claim 3 wherein the post comprises only a single homogeneous composition.

5. The integrated assembly of claim 3 wherein the post comprises a laminate of two or more different compositions.

6. The integrated assembly of claim 1 wherein the conductive structure penetrates through the foundational structure.

7. The integrated assembly of claim 6 wherein the foundational structure is configured as a wall.

8. The integrated assembly of claim 1 wherein the base comprises monocrystalline silicon, and wherein the foundational structure extends into the monocrystalline silicon of the base.

9. The integrated assembly of claim 1 wherein the foundational structure extends into the base to a depth within a range of from 50 nm to 1 micron.

10. An integrated assembly, comprising:
a base;

memory cells over the base and along channel-material-pillars;

a conductive structure extending under each of the memory cells between the memory cells and the base; the channel-material-pillars being coupled with the conductive structure; and a foundational support pins extending into the base and projecting upwardly to a level above the conductive structure, an upper surface of the support pins being below a lowest of the memory cells, the foundational support pins comprising a conductive material.

11. The integrated assembly of claim 10 wherein the foundational support pins comprise only a single homogeneous composition.

12. The integrated assembly of claim 10 wherein the foundational support pins comprise one or more of tungsten, titanium, tungsten nitride, tungsten silicide, titanium nitride and titanium silicide.

13. An integrated assembly, comprising:

a base;

a conductive-source-structure over the base;

a memory level over the conductive-source-structure and comprising memory cells along channel-material-pillars; and first foundational-support-pins extending into the base and projecting upwardly through the conductive-source-structure; and at least one second foundational-support-pin which anchors the memory level to the conductive-source-structure, and which does not extend into the base.

14. The integrated assembly of claim 13 wherein the memory cells are along conductive levels which include gate structures and routing structures; and further comprising:

a first-circuitry-level between the base and the conductive-source-structure, the first-circuitry-level comprising a wordline-driver-circuitry and a sense-amplifier-circuitry;

bitlines coupled with the channel-material-pillars; and the routing structures being coupled with the wordline-driver-circuitry and the bitlines being coupled with the sense-amplifier-circuitry.

15. The integrated assembly of claim 13 wherein the first foundational-support-pins comprise only a single homogeneous composition.

16. The integrated assembly of claim 13 wherein the first foundational-support-pins comprise an outer insulative sheath and an inner conductive core.

17. The integrated assembly of claim 13 wherein the first foundational-support-pins extend into the base to a depth of at least 50 nm.

* * * * *